(12) United States Patent
Jen et al.

(10) Patent No.: US 10,121,438 B2
(45) Date of Patent: Nov. 6, 2018

(54) SHIFT REGISTER AND DISPLAY DEVICE

(71) Applicants: HannStar Display (Nanjing) Corporation, Nanjing (CN); HannStar Display Corporation, Taipei (TW)

(72) Inventors: Tean-Sen Jen, Taoyuan (TW); Sung-Chun Lin, Tainan (TW); Hsuan-Chen Liu, Kaohsiung (TW); Chien-Ting Chan, Tainan (TW)

(73) Assignees: HannStar Display (Nanjing) Corporation, Nanjing (CN); HannStar Display Corporation, Taipei (TW)

( * ) Notice: Subject to any disclaimer, the term of this patent is extended or adjusted under 35 U.S.C. 154(b) by 186 days.

(21) Appl. No.: 15/197,786

(22) Filed: Jun. 30, 2016

(65) Prior Publication Data

US 2017/0018244 A1 Jan. 19, 2017

(30) Foreign Application Priority Data

Jul. 16, 2015 (CN) .......................... 2015 1 0419082

(51) Int. Cl.
*G11C 19/00* (2006.01)
*G09G 3/36* (2006.01)
*G11C 19/28* (2006.01)

(52) U.S. Cl.
CPC ......... *G09G 3/3677* (2013.01); *G09G 3/3696* (2013.01); *G11C 19/287* (2013.01); *G09G 2300/0809* (2013.01); *G09G 2310/0248* (2013.01); *G09G 2310/0286* (2013.01); *G11C 19/28* (2013.01)

(58) Field of Classification Search
None
See application file for complete search history.

(56) References Cited

U.S. PATENT DOCUMENTS

| 7,250,788 | B2 | 7/2007 | Lee et al. | |
|---|---|---|---|---|
| 7,446,570 | B2 | 11/2008 | Lee et al. | |
| 7,664,218 | B2 * | 2/2010 | Tobita | G09G 3/3677 377/64 |
| 2007/0217564 | A1 * | 9/2007 | Tobita | G11C 19/28 377/64 |
| 2008/0219401 | A1 * | 9/2008 | Tobita | G09G 3/3677 377/79 |
| 2009/0304138 | A1 * | 12/2009 | Tsai | G11C 19/28 377/79 |

(Continued)

*Primary Examiner* — Tuan T Lam
(74) *Attorney, Agent, or Firm* — CKC & Partners Co., Ltd.

(57) ABSTRACT

A shift register and a display device are provided. The shift register includes a pre-charge unit, a pull-up unit, a first pull-down unit and a second pull-down unit. The pre-charge unit receives first and second input signals, and outputs a pre-charge signal via a first node. The pull-up unit receives the pre-charge signal and a clock signal, and outputs a scanning signal via a second node. The first pull-down unit receives the pre-charge signal, first and second pull-down control signals, and controls whether to pull-down the scanning signal to a reference voltage level. The second pull-down unit receives the pre-charge signal and first and second pull-down control signals, and controls whether to keep the scanning signal at the reference voltage level. The period of the first second pull-down control signal and the period of the second pull-down control signal are in a range from 12 frames to 180 frames.

14 Claims, 7 Drawing Sheets

(56) References Cited

U.S. PATENT DOCUMENTS

| | | | |
|---|---|---|---|
| 2013/0088265 A1* | 4/2013 | Chen | H03K 5/153 |
| | | | 327/108 |
| 2014/0253424 A1* | 9/2014 | Yu | G11C 19/28 |
| | | | 345/100 |
| 2015/0102991 A1* | 4/2015 | Yu | G09G 3/3648 |
| | | | 345/100 |
| 2015/0109353 A1* | 4/2015 | Yu | G11C 19/28 |
| | | | 345/691 |
| 2016/0275895 A1* | 9/2016 | Dai | G09G 3/36 |
| 2016/0335949 A1* | 11/2016 | Lin | G09G 3/2085 |
| 2017/0249916 A1* | 8/2017 | Jen | G09G 3/3677 |

* cited by examiner

SHIFT REGISTER AND DISPLAY DEVICE

RELATED APPLICATIONS

This application claims priority to Chinese Patent Application Serial Number 201510419082.8, filed on Jul. 16, 2015, which is herein incorporated by reference.

BACKGROUND

Field of the Invention

The invention relates to a shift register, and more particularly to a shift register for improving reliability and a display device having such shift register.

Description of Related Art

With advancing development technologies of thin film transistor (TFT) liquid crystal display, technologies of integrating a driving circuit on a display panel, such as a system on glass (SOG) technology, have become widely applied to conventional display devices. On the other hand, TFT may be manufactured by utilizing an amorphous silicon (a-Si) TFT manufacturing process or a low temperature polysilicon (LTPS) TFT process. One major difference between a LTPS TFT and an a-Si TFT is electricity and process complexity. The LTPS TFT has higher carrier mobility, but the manufacturing process of the LTPS TFT is more complex. Although the carrier mobility of the a-Si TFT is lower than that of the LTPS TFT, the manufacturing process of the a-Si TFT is simpler and mature, and thus the a-Si TFT has an advantage of low manufacturing cost. However, due to process capability limitations, the threshold voltage of a manufactured TFT would be increased by an effect of an added bias voltage, making it difficult to integrate a driving circuit onto a display panel. In the conventional art, a gate driving circuit with an a-Si TFT as a component would induce an unstable threshold voltage shift of some a-Si TFT components with an increasing length of use, resulting in severely affecting normal operations of a gate driving circuit or even inactive.

SUMMARY OF THE INVENTION

An objective of the invention is to provide a shift register and a display device for suppressing a threshold voltage shift of TFT components, thereby improving reliability.

One aspect of the invention is directed to a shift register which includes a pre-charge unit, a pull-up unit, a first pull-down unit and a second pull-down unit. The pre-charge unit is configured to receive a first input signal and a second input signal and output a pre-charge signal via a first node based on the first input signal and the second input signal. The pull-up unit is coupled to the pre-charge unit, and is configured to receive the pre-charge signal and a clock signal and output a scan signal via a second node based on the pre-charge signal and the clock signal. The first pull-down unit is coupled to the pre-charge unit and the pull-up unit, and is configured to receive the pre-charge signal, a first pull-down control signal and a second pull-down control signal and control whether to pull down the scan signal to a reference voltage level based on the pre-charge signal, the first pull-down control signal and the second pull-down control signal. The second pull-down unit is coupled to the pre-charge unit and the pull-up unit, and is configured to receive the pre-charge signal, the first pull-down control signal and the second pull-down control signal and control whether to keep the scan signal at the reference voltage level based on the pre-charge signal, the first pull-down control signal and the second pull-down control signal. A period of the first pull-down control signal and a period of the second pull-down control signal are in a range from 12 frames to 180 frames.

In one embodiment of the invention, the period of first pull-down control signal is substantially the same as the period of the second pull-down control signal, and the period of the first pull-down control signal and the period of the second pull-down control signal are 120 frames.

In one embodiment of the invention, the first pull-down control signal and the second pull-down control signal are substantially phase-inverted from each other.

In one embodiment of the invention, a time interval between a rising edge of the first pull-down control signal and a falling edge of the second pull-down control signal is in a range from 2 microseconds to 4 microseconds.

In one embodiment of the invention, the pre-charge unit includes a first transistor and a second transistor. A gate of the first transistor is configured to receive a starting signal, a first source/drain of the first transistor is configured to receive a forward input signal, and a second source/drain of the first transistor is configured to output the pre-charge signal. A gate and a first source/drain of the second transistor are configured to receive another scan signal outputted by a next two stage of shift register to the shift register, and a second source/drain of the second transistor is coupled to the second source/drain of the first transistor.

In one embodiment of the invention, the pre-charge unit includes a first transistor and a second transistor. A gate of the first transistor is configured to receive another scan signal outputted by a previous two stage of shift register to the shift register, a first source/drain of the first transistor is configured to receive a forward input signal, and a second source/drain of the first transistor is configured to output the pre-charge signal. A gate of the second transistor is configured to receive another scan signal outputted by a next two stage of shift register to the shift register, a first source/drain of the second transistor is configured to receive a backward input signal, and a second source/drain of the second transistor is coupled to the second source/drain of the first transistor.

In one embodiment of the invention, the pull-up unit includes a third transistor and a capacitor. A gate of the third transistor is configured to receive the pre-charge signal, a first source/drain of the third transistor is configured to receive the clock signal, and a second source/drain of the third transistor is configured to output the scan signal. A first terminal of the capacitor is coupled to the gate of the third terminal, and a second terminal of the capacitor is coupled to the second source/drain of the third transistor.

In one embodiment of the invention, the first pull-down unit includes a fourth transistor, a fifth transistor, a sixth transistor, a seventh transistor and an eighth transistor. A gate and a first source/drain the fourth transistor are configured to input the first pull-down control signal. A gate of the fifth transistor is configured to input the second pull-down control signal, a first source/drain of the fifth transistor is configured to input the reference voltage level, and a second source/drain of the fifth transistor is coupled to the second source/drain of the fourth transistor. A gate of the sixth transistor is coupled to the first node, a first source/drain of the sixth transistor is configured to input the reference voltage level, and a second source/drain of the sixth transistor is coupled to the second source/drain of the fourth transistor. A gate of the seventh transistor is coupled to the second source/drain of the sixth transistor, a first source/drain of the seventh transistor is configured to input the reference voltage level, and a second source/drain of the seventh transistor is coupled to the first node. A gate of the eighth transistor is coupled to the second source/drain of the sixth transistor, a first source/drain of the eighth transistor is configured to input the reference voltage level, and a second source/drain of the eighth transistor is coupled to the second node.

In one embodiment of the invention, the second pull-down unit includes a ninth transistor, a tenth transistor, an eleventh transistor, a twelfth transistor and a thirteenth transistor. A gate and a first source/drain of the ninth transistor are configured to input the second pull-down control signal. A gate of the tenth transistor is configured to input the first pull-down control signal, a first source/drain of the tenth transistor is configured to input the reference voltage level, and a second source/drain of the tenth transistor is coupled to the second source/drain of the ninth transistor. A gate of the eleventh transistor is coupled to the first node, a first source/drain of the eleventh transistor is configured to input the reference voltage level, and a second source/drain of the eleventh transistor is coupled to the second source/drain of the ninth transistor. A gate of the twelfth transistor is coupled to the second source/drain of the eleventh transistor, a first source/drain of the twelfth transistor is configured to input the reference voltage level, and a second source/drain of the twelfth transistor is coupled to the first node. A gate of the thirteenth transistor is coupled to the second source/drain of the eleventh transistor, a first source/drain of the thirteenth transistor is configured to input the reference voltage level, and a second source/drain of the thirteenth transistor is coupled to the second node.

Another aspect of the invention is directed to a display device which includes a display panel and a shift register. The shift register is configured to drive the display panel, which includes a pre-charge unit, a pull-up unit, a first pull-down unit and a second pull-down unit. The pre-charge unit is configured to receive a first input signal and a second input signal and output a pre-charge signal via a first node based on the first input signal and the second input signal. The pull-up unit is coupled to the pre-charge unit, and is configured to receive the pre-charge signal and a clock signal and output a scan signal via a second node based on the pre-charge signal and the clock signal. The first pull-down unit is coupled to the pre-charge unit and the pull-up unit, and is configured to receive the pre-charge signal, a first pull-down control signal and a second pull-down control signal and control whether to pull down the scan signal to a reference voltage level based on the pre-charge signal, the first pull-down control signal and the second pull-down control signal. The second pull-down unit coupled to the pre-charge unit and the pull-up unit, and is configured to receive the pre-charge signal, the first pull-down control signal and the second pull-down control signal and control whether to keep the scan signal at the reference voltage level based on the pre-charge signal, the first pull-down control signal and the second pull-down control signal. A period of the first pull-down control signal and a period of the second pull-down control signal are in a range from 12 frames to 180 frames.

In one embodiment of the invention, the period of first pull-down control signal is substantially the same as the period of the second pull-down control signal, and the period of the first pull-down control signal and the period of the second pull-down control signal are 120 frames.

In one embodiment of the invention, the first pull-down control signal and the second pull-down control signal are substantially phase-inverted from each other.

In one embodiment of the invention, a time interval between a rising edge of the first pull-down control signal and a falling edge of the second pull-down control signal is in a range from 2 microseconds to 4 microseconds.

Another aspect of the invention is directed to a display device which includes a display panel and a gate driver. The gate driver is configured to drive the display panel and has $1^{st}$-$N^{th}$ stage shift registers. The $i^{th}$ stage shift register of the $1^{st}$-$N^{th}$ stage shift registers includes a pre-charge unit, a pull-up unit, a first pull-down unit and a second pull-down unit. The pre-charge unit is configured to receive a first input signal and a second input signal and output a pre-charge signal via a first node based on the first input signal and the second input signal. The pull-up unit is coupled to the pre-charge unit, and is configured to receive the pre-charge signal and a clock signal of first clock signals and output an $i^{th}$ stage scan signal via a second node based on the pre-charge signal and the clock signal. The first pull-down unit is coupled to the pre-charge unit and the pull-up unit, and is configured to receive the pre-charge signal, a first pull-down control signal and a second pull-down control signal and control whether to pull down the scan signal to a reference voltage level based on the pre-charge signal, the first pull-down control signal and the second pull-down control signal. The second pull-down unit coupled to the pre-charge unit and the pull-up unit, and is configured to receive the pre-charge signal, the first pull-down control signal and the second pull-down control signal and control whether to keep the scan signal at the reference voltage level based on the pre-charge signal, the first pull-down control signal and the second pull-down control signal. A period of the first pull-down control signal and a period of the second pull-down control signal are in a range from 12 frames to 180 frames.

In one embodiment of the invention, the period of first pull-down control signal is substantially the same as the period of the second pull-down control signal, and the period of the first pull-down control signal and the period of the second pull-down control signal are 120 frames.

In one embodiment of the invention, the first pull-down control signal and the second pull-down control signal are substantially phase-inverted from each other.

In one embodiment of the invention, a time interval between a rising edge of the first pull-down control signal and a falling edge of the second pull-down control signal is in a range from 2 microseconds to 4 microseconds.

In one embodiment of the invention, the pre-charge unit of the $i^{th}$ stage shift register includes a first transistor and a second transistor. A gate of the first transistor is configured to receive a first input signal, a first source/drain of the first transistor is configured to receive a forward input signal, and a second source/drain of the first transistor is configured to output the pre-charge signal. A gate and a first source/drain of the second transistor are configured to receive a second input signal, and a second source/drain of the second transistor is coupled to the second source/drain of the first transistor. When i is 1 or 2, the first input signal is a starting signal, and the second input signal is an $(i+2)^{th}$ stage scan signal outputted by the $(i+2)^{th}$ stage shift register of the $1^{st}$-$N^{th}$ stage shift registers. When i is (N-1) or N, the first input signal is an $(i-2)^{th}$ stage scan signal outputted by the $(i-2)^{th}$ stage shift register of the $1^{st}$-$N^{th}$ stage shift registers, and the second input signal is an ending signal. When i is from 3 to (N-2), the first input signal is an $(i-2)^{th}$ stage scan signal outputted by the $(i-2)^{th}$ stage shift register of the $1^{st}$-$N^{th}$ stage shift registers, and the second input signal is an $(i+2)^{th}$ stage scan signal outputted by the $(i+2)^{th}$ stage shift register of the $1^{st}$-$N^{th}$ stage shift registers.

In one embodiment of the invention, the pre-charge unit of the $i^{th}$ stage shift register includes a first transistor and a second transistor. A gate of the first transistor is configured to receive a first input signal, a first source/drain of the first transistor is configured to receive a forward input signal, and a second source/drain of the first transistor is configured to output the pre-charge signal. A gate of the second transistor is configured to receive a second input signal, a first source/drain of the second transistor is configured to receive a backward input signal, and a second source/drain of the second transistor is coupled to the second source/drain of the first transistor. When i is (N-1) or N, the first input signal is an $(i-2)^{th}$ stage scan signal outputted by the $(i-2)^{th}$ stage shift register of the $1^{st}$-$N^{th}$ stage shift registers, and the second input signal is an ending signal. When i is from 3 to (N-2), the first input signal is an $(i-2)^{th}$ stage scan signal outputted by the $(i-2)^{th}$ stage shift register of the $1^{st}$-$N^{th}$ stage shift registers, and the second input signal is an $(i+2)^{th}$ stage scan signal outputted by the $(i+2)^{th}$ stage shift register of the $1^{st}$-$N^{th}$ stage shift registers.

In one embodiment of the invention, the pull-up unit of the $i^{th}$ stage shift register includes a third transistor and a capacitor. A gate of the third transistor is configured to receive the pre-charge signal, a first source/drain of the third transistor is configured to receive the clock signal, and a second source/drain of the third transistor is configured to output the $i^{th}$ stage scan signal. A first terminal of the capacitor is coupled to the gate of the third terminal, and a second terminal of the capacitor is coupled to the second source/drain of the third transistor.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION OF THE INVENTION

The detailed explanation of the invention is described as following. The described preferred embodiments are presented for purposes of illustrations and description, and they are not intended to limit the scope of the invention.

Figure 1:
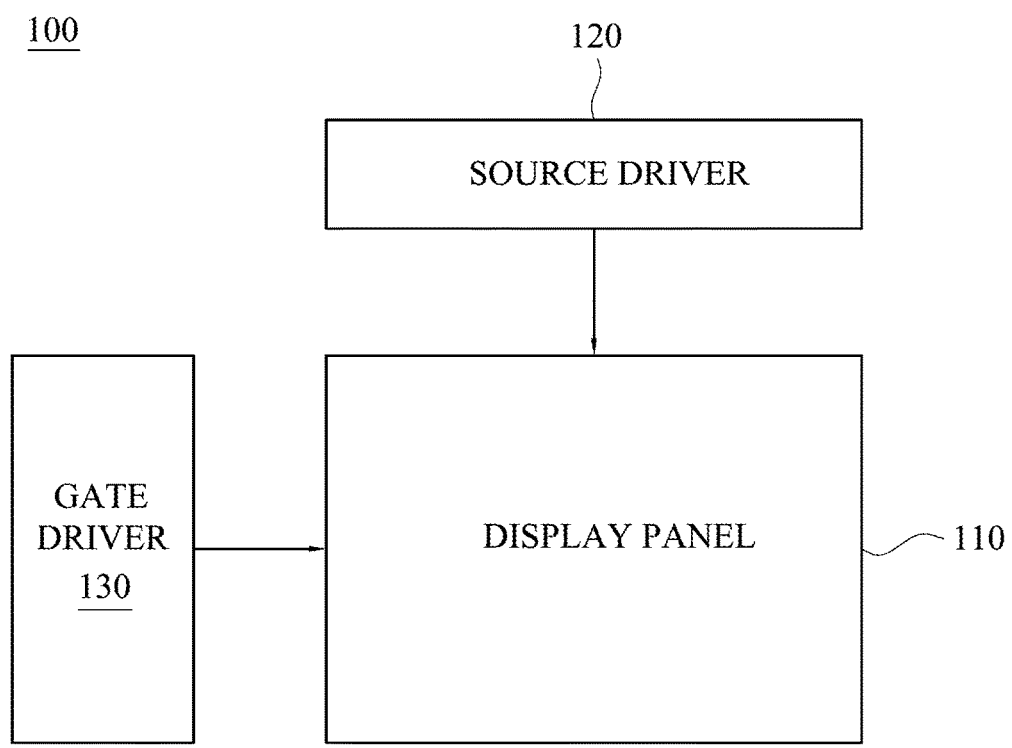
FIG. 1 is a schematic diagram of a display device in accordance with some embodiments of the invention.

Please refer to FIG. 1, which is a schematic diagram of a display device 100 in accordance with some embodiments of the invention. The display device 100 includes a display panel 110, a source driver 120 and a gate driver 130. The display panel 110 includes pixels arranged in a matrix for collectively displaying an image. The display panel 110 may be, for example, a liquid crystal display (LCD) panel of twisted nematic (TN) mode, in-plane switching (IPS) mode, fringe-field switching (FFS) mode, vertical alignment (VA) mode or other different modes, or an organic light-emitting diode (OLED) display panel. The source driver 120 is electrically connected to the display panel 110, and is configured to convert image data into source driving signals and transmit the source driving signals to the display panel 110. The gate driver 130 is configured to generate gate driving signals and transmit the gate driving signals to the display panel 110. The display panel 110 displays an image by the driving of the source driving signals and the gate driving signals.

Figure 2:
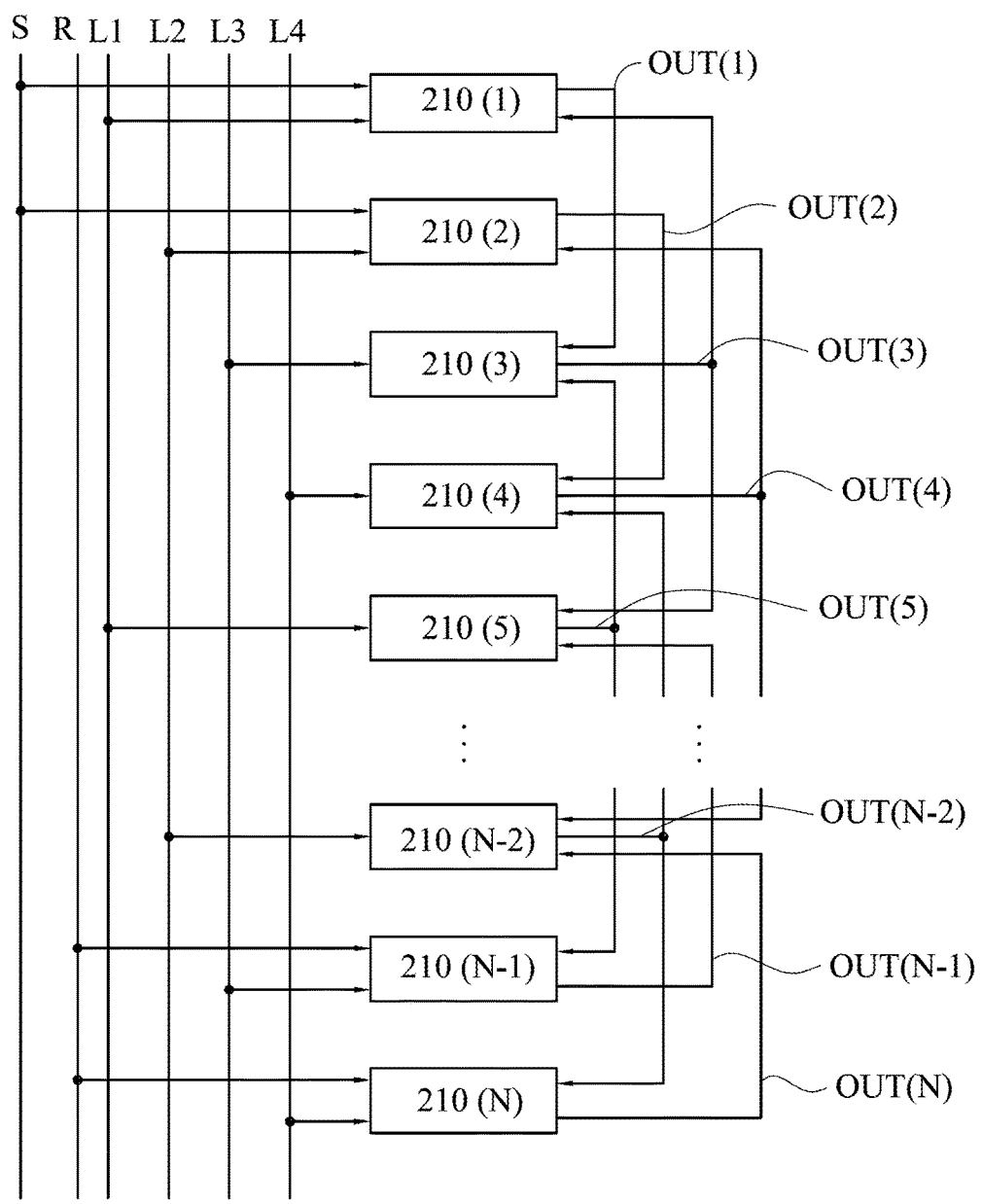
FIG. 2 is a schematic structural diagram of a gate driving circuit in accordance with some embodiments of the invention.

Please refer to FIG. 2, which is a schematic structural diagram of a gate driving circuit 200 in accordance with some embodiments of the invention. The gate driving circuit 200 is applicable to the display device 100 of FIG. 1 or another similar display device. In the following, the display device 100 of FIG. 1 is exemplified for description. The gate driving circuit 200 is a part of the gate driver 130. The gate driving circuit 200 includes clock signal lines L1-L4, a starting signal line S, an ending signal line R and N stage shift registers 210(1)-210(N), where N is an integer greater than or equal to 5. In some embodiments, N is a multiple of 4. The clock signal lines L1-L4 are respectively configured to provide clock signals C1-C4 for the corresponding shift registers 210(1)-210(N). In FIG. 2, the clock signal lines L1-L4 respectively provide the clock signals C1-C4 to the corresponding shift registers 210(1)-210(N). In addition, the starting signal line S provides a starting signal STV to the $1^{st}$ stage shift register 210(1) and the $2^{nd}$ stage shift register 210(2), and the ending signal line R provides an ending signal RSTV to the $(N-1)^{th}$ stage shift register 210(N-1) and the $N^{th}$ stage shift register 210(N). The shift registers 210(1)-210(N) respectively generate scan signals OUT(1)-OUT(N). The scan signals OUT(1) and OUT(2) are respectively inputted to the $3^{rd}$ stage shift registers 210(3) ant the $4^{th}$ stage shift register 210(4), the scan signals OUT(N-1) and OUT(N) are respectively inputted to the $(N-3)^{th}$ stage shift register 210(N-3) and the $(N-2)^{th}$ stage shift register 210(N-2), and each of the other scan signals OUT(3)-OUT(N-2) is inputted to the shift registers previous two stage of shift register thereto and next two stage of shift register thereto. For illustration, the scan signal OUT(3) is inputted to the $1^{st}$ stage shift register 210(1) and the $5^{th}$ stage shift register 210(5).

Figure 3:
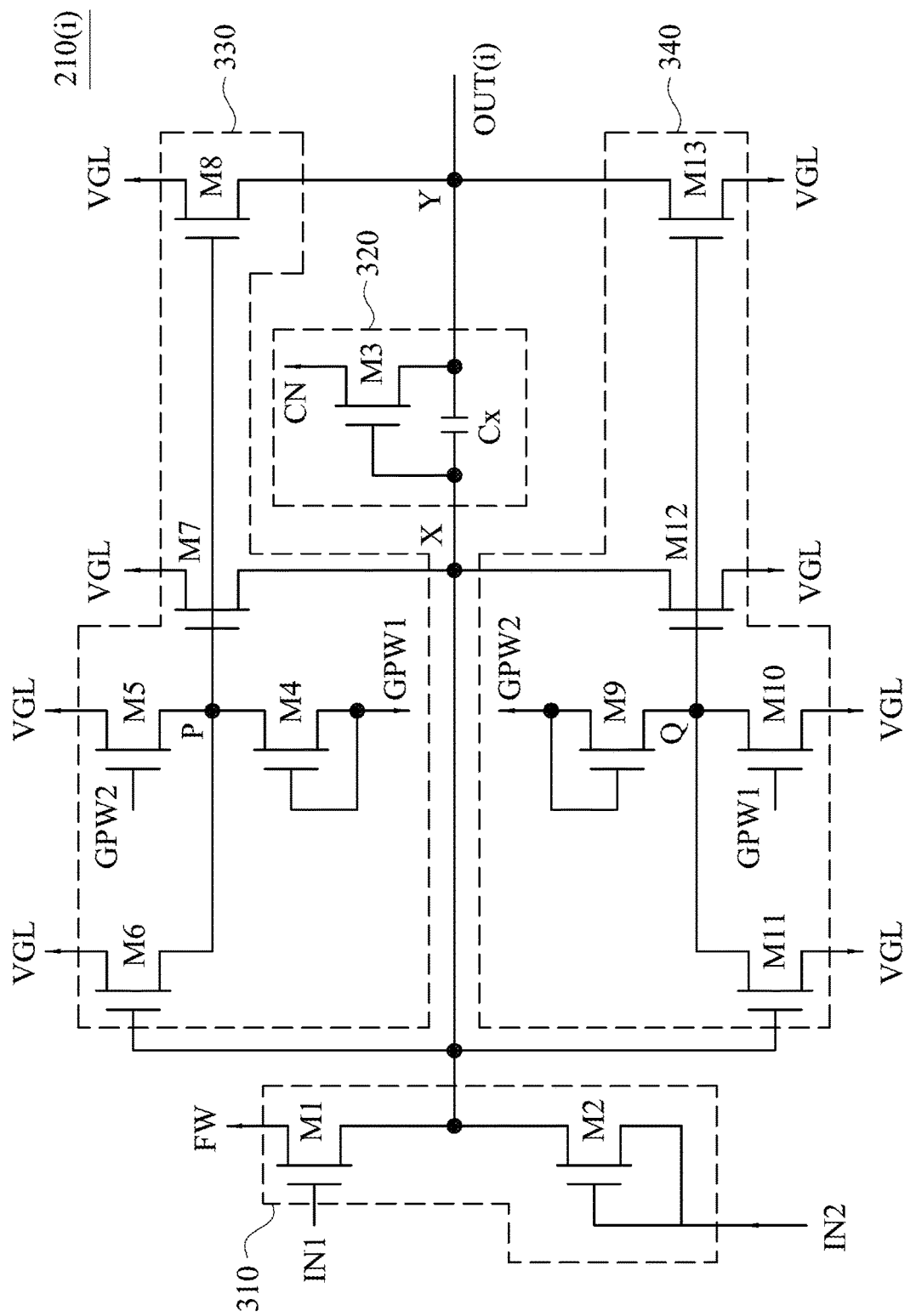
FIG. 3 is an equivalent circuit diagram of a shift register of the gate driving circuit in FIG. 2.

FIG. 3 is an equivalent circuit diagram of the $i^{th}$ stage shift register 210(i) of the gate driving circuit 200 in FIG. 2, where i is an integer from 1 to N. The $i^{th}$ stage shift register 210(i) includes a pre-charge unit 310, a pull-up unit 320, a first pull-down unit 330 and a second pull-down unit 340.

The pre-charge unit 310 is configured to receive input signals IN1 and IN2, and outputs a pre-charge signal via the node X based on the input signals IN1 and IN2. The pre-charge unit 310 includes transistors M1 and M2. In this embodiment, the gate driving circuit 200 performs one-way scanning, and in each of the shift registers 210(1)-210(N), the gate of the transistor M1 is configured to receive the input signal IN1, the first source/drain of the transistor M1 is configured to receive a forward input signal FW, and the second source/drain of the transistor M1 is configured to output the pre-charge signal. The gate and the first source/drain of the transistor M2 is configured to receive the input signal IN2, and the second source/drain of the transistor M2 is coupled to the second source/drain of the transistor M1.

If the shift register 210(i) is the 1$^{st}$ stage shift register 210(1) or the 2$^{nd}$ stage shift register 210(2), the input signal IN1 is the starting signal STV, and the input signal IN2 is the scan signal OUT(i+2) outputted by the (i+2)$^{th}$ stage shift register 210(i+2). If the shift register 210(i) is one of the 3$^{rd}$ stage shift register 210(3) to the (N-2)$^{th}$ stage shift register 210(N-2), the input signal IN1 is the scan signal OUT(i-2) outputted by the (i-2)$^{th}$ stage shift register 210(i-2), and the input signal IN2 is the scan signal OUT(i+2) outputted by the (i+2)$^{th}$ stage shift register 210(i+2). If the shift register 210(i) is the (N-1)$^{th}$ stage shift register 210(N-1) or the N$^{th}$ stage shift register 210(N), the input signal IN1 is the scan signal OUT(i-2) outputted by the (i-2)$^{th}$ stage shift register 210(i-2), and the input signal IN2 is the ending signal RSTV.

The pull-up unit 320 is coupled to the pre-charge unit 310, and is configured to receive the pre-charge signal and a clock signal CN and output the scan signal OUT(i) via the node Y based on the pre-charge signal and the clock signal CN, in which the clock signal CN is one of the clock signals C1-C4. The pull-up unit 320 includes a transistor M3 and a capacitor Cx. The gate of the transistor M3 is configured to receive the pre-charge signal, the first source/drain of the transistor M3 is configured to receive the clock signal CN, and the second source/drain of the transistor M3 is configured to output the scan signal OUT(i). The first terminal of the capacitor Cx is coupled to the gate of the transistor M3, and the second terminal of the capacitor Cx is coupled to the second source/drain of the transistor M3.

The first pull-down unit 330 is coupled to the pre-charge unit 310 and the pull-up unit 320. The first pull-down unit 330 is configured to receive the pre-charge signal and the pull-down control signals GPW1 and GPW2 and control whether to pull down the scan signal OUT(i) to the reference voltage level VGL based on the pre-charge signal and the pull-down control signals GPW1 and GPW2. The first pull-down unit 330 includes transistors M4-M8. The transistors M4-M8 can be amorphous silicon (a-Si) TFTs or low temperature polysilicon (LTPS) TFTs, but are not limited thereto. The gate and the first source/drain of the transistor M4 are configured to input the pull-down control signal GPW1. The gate of the transistor M5 is configured to input the pull-down control signal GPW2, the first source/drain of the transistor M5 is coupled to input the reference voltage level VGL, and the second source/drain of the transistor M5 is coupled to the second source/drain of the transistor M4. The gate of the transistor M6 is coupled to the node X, the first source/drain of the transistor M6 is configured to input the reference voltage level VGL, and the second source/drain of the transistor M6 is coupled to the second source/drain of the transistor M4. The gate of the transistor M7 is coupled to the second source/drain of the transistor M6, the first source/drain of the transistor M7 is configured to input the reference voltage level VGL, and the second source/drain of the transistor M7 is coupled to the node X. The gate of the transistor M8 is coupled to the second source/drain of the transistor M6, the first source/drain of the transistor M8 is configured to input the reference voltage level VGL, and the second source/drain of the transistor M8 is coupled to the node Y. When the voltage level of the pull-down control signal GPW1 is low and the voltage level of the pull-down control signal GPW2 is high, the voltage level of the node P is low. When the voltage level of the pull-down control signal GPW1 is high and the voltage level of the pull-down control signal GPW2 is low, the voltage level of the node P is high.

The second pull-down unit 340 is coupled to the pre-charge unit 310 and the pull-up unit 320. The second pull-down unit 340 is configured to receive the pre-charge signal and the pull-down control signals GPW1 and GPW2 and control whether to keep the scan signal OUT(i) at the reference voltage level VGL based on the pre-charge signal and the pull-down control signals GPW1 and GPW2. The second pull-down unit 340 includes transistors M9-M13. The transistors M9-M13 can be a-Si TFTs or LTPS TFTs, but are not limited thereto. The gate and the first source/drain of the transistor M9 are configured to input the pull-down control signal GPW2. The gate of the transistor M10 is configured to input the pull-down control signal GPW1, the first source/drain of the transistor M10 is coupled to input the reference voltage level VGL, and the second source/drain of the transistor M10 is coupled to the second source/drain of the transistor M9. The gate of the transistor M11 is coupled to the node X, the first source/drain of the transistor M11 is configured to input the reference voltage level VGL, and the second source/drain of the transistor M11 is coupled to the second source/drain of the transistor M9. The gate of the transistor M12 is coupled to the second source/drain of the transistor M11, the first source/drain of the transistor M12 is configured to input the reference voltage level VGL, and the second source/drain of the transistor M12 is coupled to the node X. The gate of the transistor M13 is coupled to the second source/drain of the transistor M11, the first source/drain of the transistor M13 is configured to input the reference voltage level VGL, and the second source/drain of the transistor M13 is coupled to the node Y. When the voltage level of the pull-down control signal GPW1 is low and the voltage level of the pull-down control signal GPW2 is high, the voltage level of the node Q is high. When the voltage level of the pull-down control signal GPW1 is high and the voltage level of the pull-down control signal GPW2 is low, the voltage level of the node Q is low.

Figure 4:
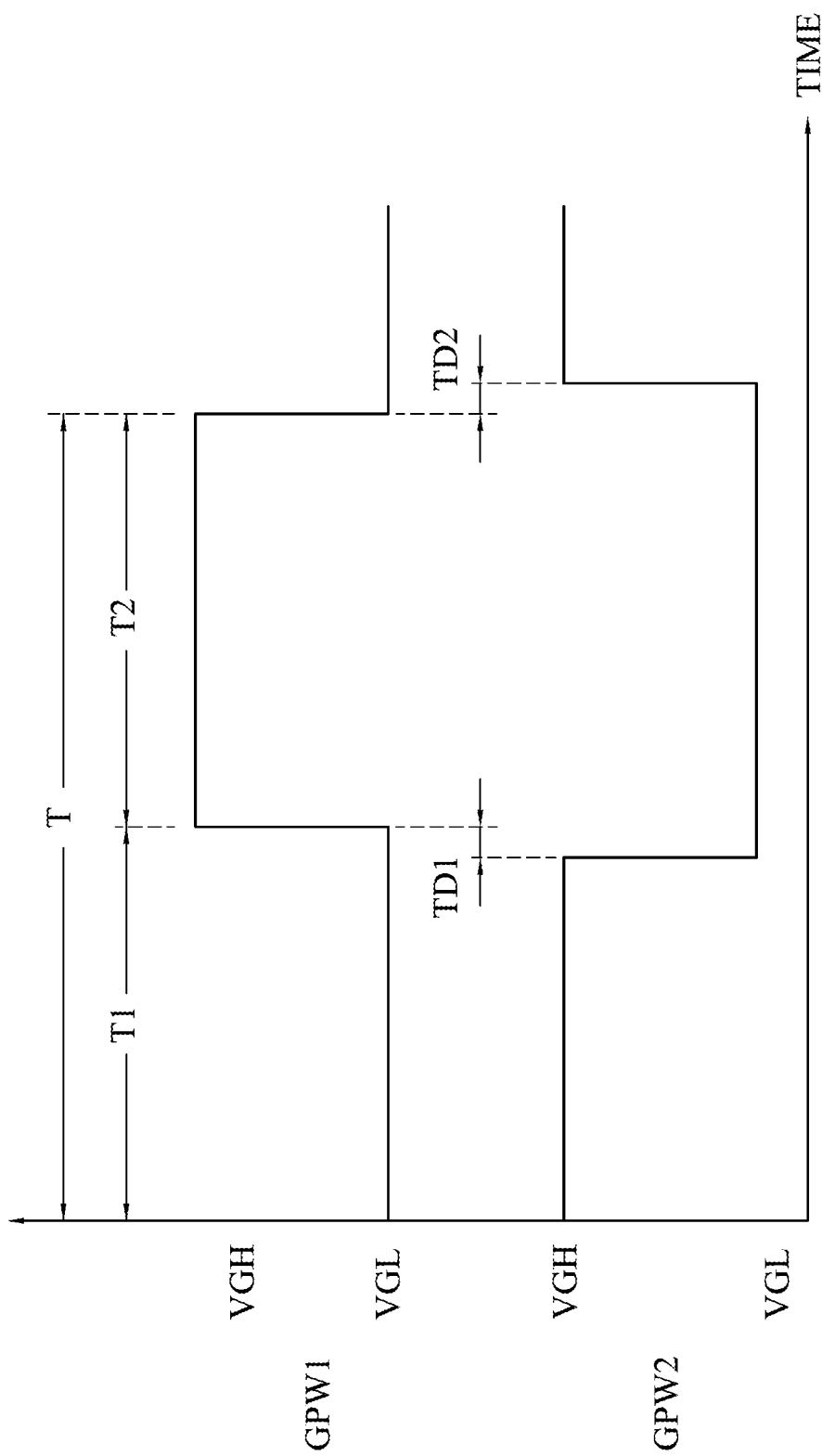
FIG. 4 is a time sequential diagram of pull-down control signals in FIG. 3.

Please refer to FIG. 4. FIG. 4 is a time sequential diagram of the pull-down control signals GPW1 and GPW2 of the i$^{th}$ stage shift register 210(i) in FIG. 3. When the voltage level of the pull-down control signal GPW1 is low and the voltage level of the pull-down control signal GPW2 is high, the voltage level of the nodes P and Q are respectively low and high. When the voltage level of the pull-down control signal GPW1 is high and the voltage level of the pull-down control signal GPW2 is low, the voltage level of the nodes P and Q are respectively high and low. The period T of the pull-down control signal GPW1 is the sum of the high level duration T1 and the low level duration T2 of the pull-down control signal GPW1. The period T is in a range from 12 frames to 180 frames. For illustration, if the frame rate of the display device 100 is 60 frames per second, the period T is from 0.2 seconds to 3 seconds. The period of the pull-down control signals GPW1 and GPW2 may be the same, and in some embodiments, the period of the pull-down control signals GPW1 and GPW2 is 120 frames. In some embodiments, as shown in FIG. 4, the time interval TD1 between the rising edge of the pull-down control signal GPW1 and the falling edge of the pull-down control signal GPW2 is in a range from 2 microseconds to 4 microseconds. Similarly, the time interval TD2 between the falling edge of the pull-down control signal GPW1 and the rising edge of the pull-down control signal GPW2 is in a range from 2 microseconds to 4 microseconds. Further, in some embodiments, the pull-down control signals GPW1 and GPW2 are substantially phase-inverted from each other. That is, the time interval TD1 between the rising edge of the pull-down control signal GPW1 and the falling edge of the pull-down control signal GPW2 and the time interval TD2 between the falling edge of the pull-down control signal GPW1 and the rising edge of the pull-down control signal GPW2 are substantially 0. In practice, the duration of the time intervals TD1 and TD2 can be correspondingly adjusted in accordance with various design requirements.

By applying the period settings of the invention to the pull-down control signals GPW1 and GPW2, the period of the voltage level at the nodes P and Q can be correspondingly expanded, so as to effectively adjust the threshold voltage of the transistors M6, M8, M11 and M13 to avoid over-shifting. As such, normal operations of the gate driver 130 are ensured, and the reliability and stableness of the display device 100 are improved.

Figure 5:
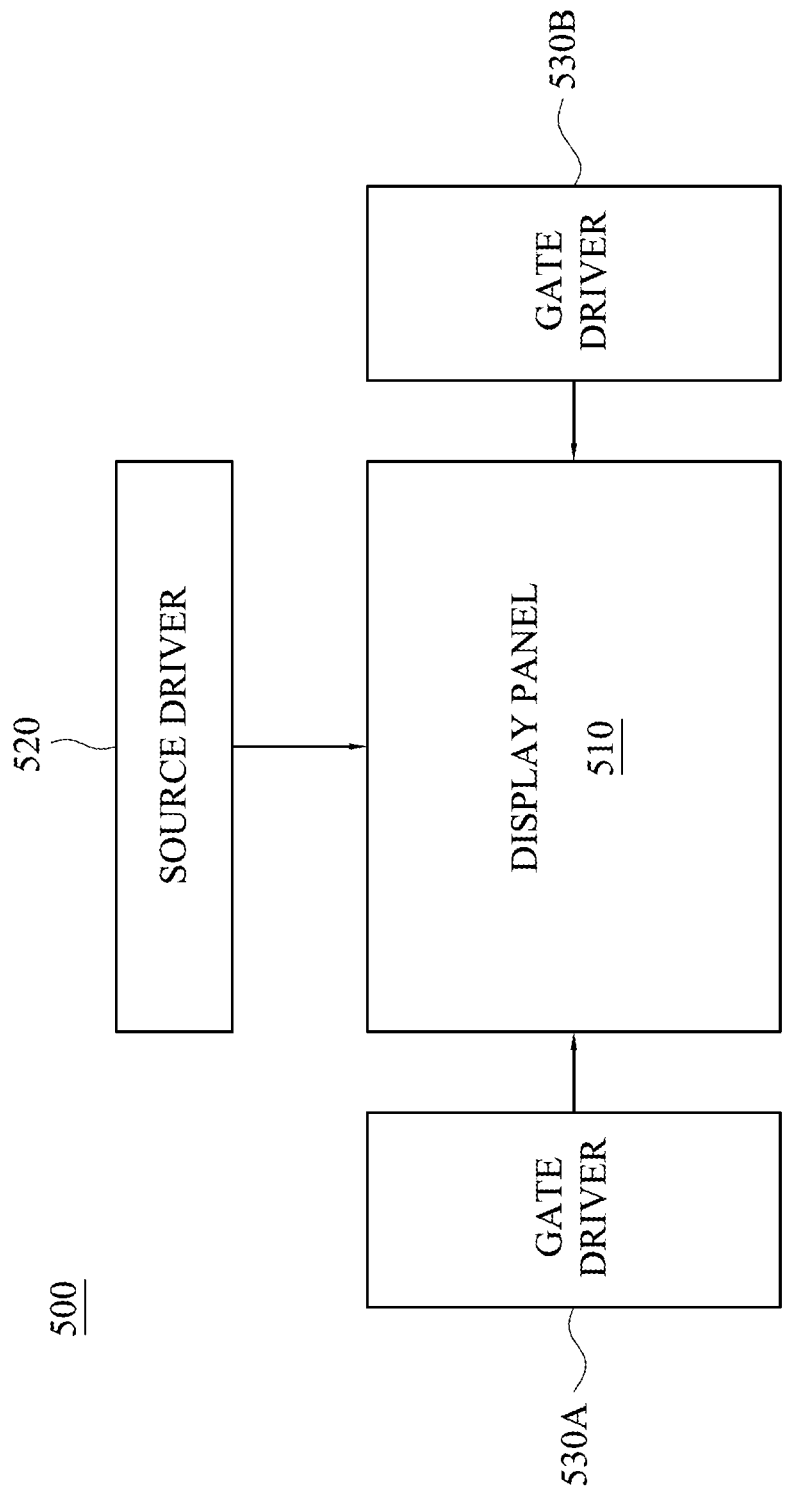
FIG. 5 is a schematic diagram of another display device in accordance with some embodiments of the invention.

The configuration to the signals in the aforementioned embodiments may also be applied to a display device which is driven simultaneously at left and right sides. Please refer to FIG. 5, which is a schematic diagram of a display device 500 in accordance with some embodiments of the invention. The display device 500 includes a display panel 510, a source driver 520 and gate drivers 530A and 530B. The display device 500 is similar to the display device 100 of FIG. 1. The difference between the display devices 100 and 500 is that the display device 500 includes two gate drivers 530A and 530B. As shown in FIG. 5, the gate drivers 530A and 530B are disposed at the left and right side of the display panel 510, respectively, and collectively transmit gate driving signals to the display panel 510. In another embodiment, the disposal of the gate drivers 530A and 530B may be adjusted in accordance with various design requirements. The display panel 510 and the source driver 520 are approximately the same as the display panel 110 and the source driver 120 of FIG. 1, respectively, and the description is not repeated herein.

Figure 6:
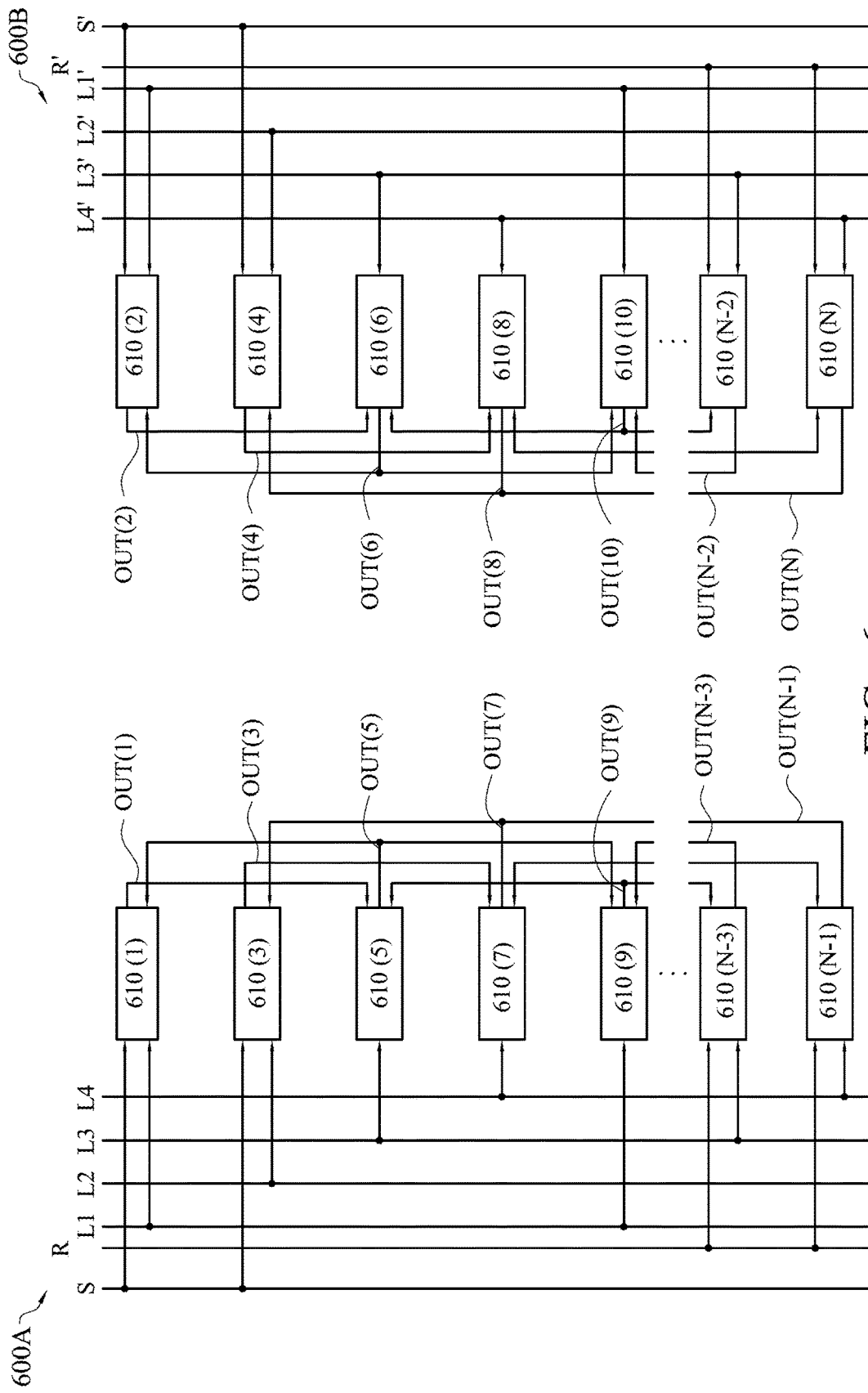
FIG. 6 is a schematic structural diagram of a gate driving circuit in accordance with some embodiments of the invention.

Please refer to FIG. 6, which is a schematic structural diagram of gate driving circuits 600A and 600B in accordance with some embodiment of the invention. The gate driving circuits 600A and 600B are applicable to the display device 500 of FIG. 5 or another similar display device. In the following, the display device 500 of FIG. 5 is exemplified for description. The gate driving circuits 600A and 600B are respectively a part of the gate drivers 530A and 530B. The gate driving circuit 600A includes clock signal lines L1-L4, a starting signal line S, an ending signal line R and odd-numbered stage shift registers 610(1), 610(3), ..., 610(N-1) of N stage shift registers 610(1)-610(N), and the gate driving circuit 600B includes clock signal lines L1'-L4', a starting signal line S', an ending signal line R' and even-numbered stage shift registers 610(2), 610(4), ..., 610(N) of the N stage shift registers 610(1)-610(N), where N is an integer greater than or equal to 9. In some embodiments, N is a multiple of 8. The clock signal lines L1-L4 and L1'-L4' are configure to respectively provide clock signals C1-C4 and C1'-C4' for the corresponding shift registers 610(1)-610(N). In addition, the starting signal line S provides a starting signal SW to the $1^{st}$ stage shift register 610(1) and the $3^{rd}$ stage shift register 610(3), the starting signal line S' provides a starting signal STV' to the $2^{nd}$ stage shift register 610(2) and the $4^{th}$ stage shift register 610(4), the ending signal line R provides an ending signal RSTV to the $(N-3)^{th}$ stage shift register 610(N-3) and the $(N-1)^{th}$ stage shift register 610(N-1), and the ending signal line R' provides an ending signal RSTV' to the $(N-2)^{th}$ stage shift register 610(N-2) and the $N^{th}$ stage shift register 610(N). The shift registers 610(1)-610(N) respectively generate scan signals OUT(1)-OUT(N). The scan signals OUT(1)-OUT(4) are respectively inputted to the $5^{th}$ to $8^{th}$ stage shift registers 610(5)-610(8), the scan signals OUT(N-3)-OUT(N) are respectively inputted to the $(N-7)^{th}$ to $(N-4)^{th}$ stage shift registers 610(N-7)-610(N-4), and each of the other scan signals OUT(5)-OUT(N-4) is inputted to the shift registers previous four stage of shift register thereto and next four stage of shift register thereto. For illustration, the scan signal OUT(5) is inputted to the $1^{st}$ stage shift register 610(1) and the $9^{th}$ stage shift register 610(9).

Figure 7:
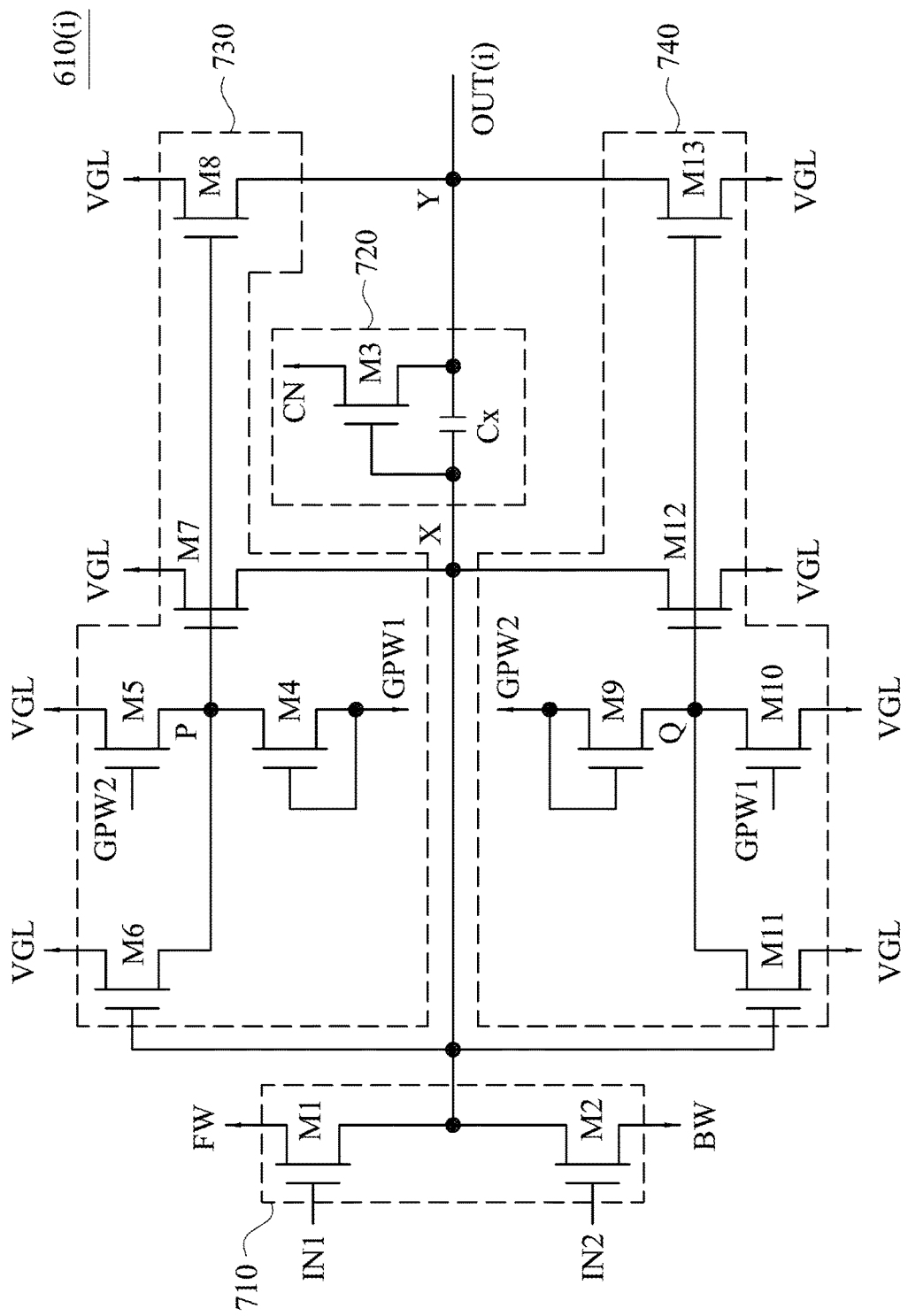
FIG. 7 is an equivalent circuit diagram of a shift register of the gate driving circuit in FIG. 6.

FIG. 7 is an equivalent circuit diagram of the $i^{th}$ stage shift register 610(i) of the gate driving circuits 600A and 600B in FIG. 6, where i is an integer from 1 to N. The $i^{th}$ stage shift register 610(i) includes a pre-charge unit 710, a pull-up unit 720, a first pull-down unit 730 and a second pull-down unit 740.

The pre-charge unit 710 is configured to receive input signals IN1 and IN2, and outputs a pre-charge signal via the node X based on the input signals IN1 and IN2. The pre-charge unit 710 includes transistors M1 and M2. In this embodiment, the gate driving circuits 600A and 600B perform two-way scanning, and in each of the shift registers 610(1)-610(N), the gate of the transistor M1 is configured to receive the input signal IN1, the first source/drain of the transistor M1 is configured to receive a forward input signal FW, and the second source/drain of the transistor M1 is configured to output the pre-charge signal. The gate of the transistor M2 is configured to receive the input signal IN2, the first source/drain of the transistor M2 is configured to receive a backward input signal BW, and the second source/drain of the transistor M2 is coupled to the second source/drain of the transistor M1.

If the shift register 610(i) is one of the $1^{st}$ stage shift register 610(1) to the $4^{th}$ stage shift register 610(4), the input signal IN1 is the starting signal STV or the starting signal STV', and the input signal IN2 is the scan signal OUT(i+4) outputted by the $(i+4)^{th}$ stage shift register 610(i+4). If the shift register 610(i) is one of the $5^{th}$ stage shift register 610(5) to the $(N-4)^{th}$ stage shift register 610(N-4), the input signal IN1 is the scan signal OUT(i-4) outputted by the $(i-4)^{th}$ stage shift register 610(i-4), and the input signal IN2 is the scan signal OUT(i+4) outputted by the $(i+4)^{th}$ stage shift register 610(i+4). If the shift register 610(i) is one of the $(N-3)^{th}$ stage shift register 610(N-3) to the $N^{th}$ stage shift register 610(N), the input signal IN1 is the scan signal OUT(i-4) outputted by the $(i-4)^{th}$ stage shift register 610(i-4), and the input signal IN2 is the ending signal RSTV or the ending signal RSTV'.

The pull-up unit 720, the first pull-down unit 730 and the second pull-down unit 740 are similar to the pull-up unit 320, the first pull-down unit 330 the second pull-down unit 340 of FIG. 3, respectively, and thus the description of the pull-up unit 720, the first pull-down unit 730 and the second pull-down unit 740 may be referred to the preceding paragraphs and is not described again herein.

Please refer to the time sequential diagram shown in FIG. 4 again, the period T of the pull-down control signal GPW1 is in a range from 12 frames to 180 frames. For illustration, if the frame rate of the display device 100 is 60 frames per second, the period T is from 0.2 seconds to 3 seconds. The period of the pull-down control signals GPW1 and GPW2 may be the same, and in some embodiments, the period of the pull-down control signals GPW1 and GPW2 are 120 frames. In some embodiments, as shown in FIG. 4, the time interval TD1 between the rising edge of the pull-down control signal GPW1 and the falling edge of the pull-down control signal GPW2 is in a range from 2 microseconds to 4 microseconds. Similarly, the time interval TD2 between the falling edge of the pull-down control signal GPW1 and the rising edge of the pull-down control signal GPW2 is in a range from 2 microseconds to 4 microseconds. Further, in some embodiments, the pull-down control signals GPW1 and GPW2 are substantially phase-inverted from each other. By applying the period configurations of the invention to the pull-down control signals GPW1 and GPW2, the period of the voltage level at the nodes P and Q can be correspondingly expanded, so as to effectively adjust the threshold voltage of the transistors M6, M8, M11 and M13 to avoid over-shifting. As such, normal operations of the gate drivers 530A and 530B are ensured, and the reliability and stableness of the display device 500 are improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A shift register, comprising:
    a pre-charge unit configured to receive a first input signal and a second input signal and output a pre-charge signal via a first node based on the first input signal and the second input signal;
    a pull-up unit that is coupled to the pre-charge unit, the pull-up unit configured to receive the pre-charge signal and a clock signal and output a scan signal via a second node based on the pre-charge signal and the clock signal;
    a first pull-down unit coupled to the pre-charge unit and the pull-up unit, the first pull-down unit configured to receive the pre-charge signal, a first pull-down control signal and a second pull-down control signal and control whether to pull down the scan signal to a reference voltage level based on the pre-charge signal, the first pull-down control signal and the second pull-down control signal; and
    a second pull-down unit coupled to the pre-charge unit and the pull-up unit, the second pull-down unit configured to receive the pre-charge signal, the first pull-down control signal and the second pull-down control signal and control whether to keep the scan signal at the reference voltage level based on the pre-charge signal, the first pull-down control signal and the second pull-down control signal;
    wherein periods of the first pull-down control signal and the second pull-down control signal are in a range from 12 frames to 180 frames, and a time interval between a rising edge of the first pull-down control signal and a falling edge of the second pull-down control signal is in a range from 2 microseconds to 4 microseconds.

2. The shift register of claim 1, wherein the period of the first pull-down control signal is substantially the same as the period of the second pull-down control signal, and the period of the first pull-down control signal and the period of the second pull-down control signal are 120 frames.

3. The shift register of claim 1, wherein the pre-charge unit comprises:
    a first transistor, wherein a gate of the first transistor is configured to receive a starting signal, a first source/drain of the first transistor is configured to receive a forward input signal, and a second source/drain of the first transistor is configured to output the pre-charge signal; and
    a second transistor, wherein a gate and a first source/drain of the second transistor are configured to receive another scan signal outputted by a next two stage of shift register to the shift register, and a second source/drain of the second transistor is coupled to the second source/drain of the first transistor.

4. The shift register of claim 1, wherein the pre-charge unit comprises:
    a first transistor, wherein a gate of the first transistor is configured to receive another scan signal outputted by a previous two stage of shift register to the shift register, a first source/drain of the first transistor is configured to receive a forward input signal, and a second source/drain of the first transistor is configured to output the pre-charge signal; and
    a second transistor, wherein a gate of the second transistor is configured to receive another scan signal outputted by a next two stage of shift register to the shift register, a first source/drain of the second transistor is configured to receive a backward input signal, and a second source/drain of the second transistor is coupled to the second source/ drain of the first transistor.

5. The shift register of claim 1, wherein the pull-up unit comprises:
    a third transistor, wherein a gate of the third transistor is configured to receive the pre-charge signal, a first source/drain of the third transistor is configured to receive the clock signal, and a second source/drain of the third transistor is configured to output the scan signal; and
    a capacitor, wherein a first terminal of the capacitor is coupled to the gate of the third terminal, and a second terminal of the capacitor is coupled to the second source/drain of the third transistor.

6. The shift register of claim 1, wherein the first pull-down unit comprises:
    a fourth transistor, wherein a gate and a first source/drain of the fourth transistor are configured to input the first pull-down control signal;
    a fifth transistor, wherein a gate of the fifth transistor is configured to input the second pull-down control signal, a first source/drain of the fifth transistor is configured to input the reference voltage level, and a second source/drain of the fifth transistor is coupled to the second source/drain of the fourth transistor;
    a sixth transistor, wherein a gate of the sixth transistor is coupled to the first node, a first source/drain of the sixth transistor is configured to input the reference voltage level, and a second source/drain of the sixth transistor is coupled to the second source/drain of the fourth transistor;
    a seventh transistor, wherein a gate of the seventh transistor is coupled to the second source/drain of the sixth transistor, a first source/drain of the seventh transistor is configured to input the reference voltage level, and a second source/drain of the seventh transistor is coupled to the first node; and
    an eighth transistor, wherein a gate of the eighth transistor is coupled to the second source/drain of the sixth transistor, a first source/drain of the eighth transistor is configured to input the reference voltage level, and a second source/drain of the eighth transistor is coupled to the second node.

7. The shift register of claim 1, wherein the second pull-down unit comprises:
    a ninth transistor, wherein a gate and a first source/drain of the ninth transistor are configured to input the second pull-down control signal;
    a tenth transistor, wherein a gate of the tenth transistor is configured to input the first pull-down control signal, a first source/drain of the tenth transistor is configured to input the reference voltage level, and a second source/drain of the tenth transistor is coupled to the second source/drain of the ninth transistor;
an eleventh transistor, wherein a gate of the eleventh transistor is coupled to the first node, a first source/drain of the eleventh transistor is configured to input the reference voltage level, and a second source/drain of the eleventh transistor is coupled to the second source/drain of the ninth transistor;
a twelfth transistor, wherein a gate of the twelfth transistor is coupled to the second source/drain of the eleventh transistor, a first source/drain of the twelfth transistor is configured to input the reference voltage level, and a second source/drain of the twelfth transistor is coupled to the first node; and
a thirteenth transistor, wherein a gate of the thirteenth transistor is coupled to the second source/drain of the eleventh transistor, a first source/drain of the thirteenth transistor is configured to input the reference voltage level, and a second source/drain of the thirteenth transistor is coupled to the second node.

8. A display device, comprising:
a display panel; and
a shift register configured to drive the display panel, the shift register comprising:
 a pre-charge unit configured to receive a first input signal and a second input signal and output a pre-charge signal via a first node based on the first input signal and the second input signal;
 a pull-up unit that is coupled to the pre-charge unit, the pull-up unit configured to receive the pre-charge signal and a clock signal and output a scan signal via a second node based on the pre-charge signal and the clock signal;
 a first pull-down unit coupled to the pre-charge unit and the pull-up unit, the first pull-down unit configured to receive the pre-charge signal, a first pull-down control signal and a second pull-down control signal and control whether to pull down the scan signal to a reference voltage level based on the pre-charge signal, the first pull-down control signal and the second pull-down control signal; and
 a second pull-down unit coupled to the pre-charge unit and the pull-up unit, the second pull-down unit configured to receive the pre-charge signal, the first pull-down control signal and the second pull-down control signal and control whether to keep the scan signal at the reference voltage level based on the pre-charge signal, the first pull-down control signal and the second pull-down control signal;
wherein a period of the first pull-down control signal and a period of the second pull-down control signal are in a range from 12 frames to 180 frames, and a time interval between a rising edge of the first pull-down control signal and a falling edge of the second pull-down control signal is in a range from 2 microseconds to 4 microseconds.

9. The display device of claim 8, wherein the period of the first pull-down control signal is substantially the same as the period of the second pull-down control signal, and the period of the first pull-down control signal and the period of the second pull-down control signal are 120 frames.

10. A display device, comprising:
a display panel; and
a gate driver configured to drive the display panel and having $1^{st}$-$N^{th}$ stage shift registers, wherein the $i^{th}$ stage shift register of the $1^{st}$-$N^{th}$ stage shift registers comprises:
 a pre-charge unit configured to receive a first input signal and a second input signal and output a pre-charge signal via a first node based on the first input signal and the second input signal;
 a pull-up unit that is coupled to the pre-charge unit, the pull-up unit configured to receive the pre-charge signal and a clock signal of a plurality of first clock signals and output an $i^{th}$ stage scan signal via a second node based on the pre-charge signal and the clock signal;
 a first pull-down unit coupled to the pre-charge unit and the pull-up unit, the first pull-down unit configured to receive the pre-charge signal, a first pull-down control signal and a second pull-down control signal and control whether to pull down the $i^{th}$ stage scan signal to a reference voltage level based on the pre-charge signal, the first pull-down control signal and the second pull-down control signal; and
 a second pull-down unit coupled to the pre-charge unit and the pull-up unit, the second pull-down unit configured to receive the pre-charge signal, the first pull-down control signal and the second pull-down control signal and control whether to keep the $i^{th}$ stage scan signal at the reference voltage level based on the pre-charge signal, the first pull-down control signal and the second pull-down control signal;
wherein a period of the first pull-down control signal and a period of the second pull-down control signal are in a range from 12 frames to 180 frames, a time interval between a rising edge of the first pull-down control signal and a falling edge of the second pull-down control signal is in a range from 2 microseconds to 4 microseconds, N is an integer, and i is an integer from 1 to N.

11. The display device of claim 10, wherein the period of the first pull-down control signal is substantially the same as the period of the second pull-down control signal, and the period of the first pull-down control signal and the period of the second pull-down control signal are 120 frames.

12. The display device of claim 10, wherein the pre-charge unit of the $i^{th}$ stage shift register comprises:
 a first transistor, wherein a gate of the first transistor is configured to receive a first input signal, a first source/drain of the first transistor is configured to receive a forward input signal, and a second source/drain of the first transistor is configured to output the pre-charge signal; and
 a second transistor, wherein a gate and a first source/drain of the second transistor are configured to receive a second input signal, and a second source/drain of the second transistor is coupled to the second source/drain of the first transistor;
wherein:
 when i is 1 or 2, the first input signal is a starting signal, and the second input signal is an $(i+2)^{th}$ stage scan signal outputted by the $(i+2)^{th}$ stage shift register of the $1^{st}$-$N^{th}$ stage shift registers;
 when i is (N−1) or N, the first input signal is an (i−2)th stage scan signal outputted by the (i−2)th stage shift register of the $1^{st}$-$N^{th}$ stage shift registers, and the second input signal is an ending signal;
 when i is from 3 to (N−2), the first input signal is an $(i-2)^{th}$ stage scan signal outputted by the $(i-2)^{th}$ stage shift register of the $1^{st}$-$N^{th}$ stage shift registers, and the second input signal is an $(i+2)^{th}$ stage scan signal outputted by the $(i+2)^{th}$ stage shift register of the $1^{st}$-$N^{th}$ stage shift registers.

13. The display device of claim 10, wherein the pre-charge unit of the $i^{th}$ stage shift register comprises:
   a first transistor, wherein a gate of the first transistor is configured to receive a first input signal, a first source/drain of the first transistor is configured to receive a forward input signal, and a second source/drain of the first transistor is configured to output the pre-charge signal; and
   a second transistor, wherein a gate of the second transistor is configured to receive a second input signal, a first source/drain of the second transistor is configured to receive a backward input signal, and a second source/drain of the second transistor is coupled to the second source/drain of the first transistor;
   wherein:
      when i is 1 or 2, the first input signal is a starting signal, and the second input signal is an $(i+2)^{th}$ stage scan signal outputted by the $(i+2)^{th}$ stage shift register of the $1^{st}$-$N^{th}$ stage shift registers;
      when i is (N−1) or N, the first input signal is an $(i-2)^{th}$ stage scan signal outputted by the $(i-2)^{th}$ stage shift register of the $1^{st}$-$N^{th}$ stage shift registers, and the second input signal is an ending signal;
      when i is from 3 to (N−2), the first input signal is an $(i-2)^{th}$ stage scan signal outputted by the $(i-2)^{th}$ stage shift register of the $1^{st}$-$N^{th}$ stage shift registers, and the second input signal is an $(i+2)^{th}$ stage scan signal outputted by the $(i+2)^{th}$ stage shift register of the $1^{st}$-$N^{th}$ stage shift registers.

14. The display device of claim 10, wherein the pull-up unit of the $i^{th}$ stage shift register comprises:
   a third transistor, wherein a gate of the third transistor is configured to receive the pre-charge signal, a first source/drain of the third transistor is configured to receive the clock signal, and a second source/drain of the third transistor is configured to output the scan signal; and
   a capacitor, wherein a first terminal of the capacitor is coupled to the gate of the third terminal, and a second terminal of the capacitor is coupled to the second source/drain of the third transistor.

* * * * *